United States Patent [19]
Gardner et al.

[11] Patent Number: 5,937,302
[45] Date of Patent: Aug. 10, 1999

[54] METHOD OF FORMING LIGHTLY DOPED DRAIN REGION AND HEAVILY DOPING A GATE USING A SINGLE IMPLANT STEP

[75] Inventors: Mark I. Gardner, Cedar Creek; Frederick N. Hause, Austin, both of Tex.

[73] Assignee: Advanced Micro Devices, Inc., Sunnyvale, Calif.

[21] Appl. No.: 08/781,092

[22] Filed: Jan. 8, 1997

[51] Int. Cl.$^6$ .................................................. H01L 21/336
[52] U.S. Cl. ..................... 438/305; 438/299; 438/301; 438/303; 438/294
[58] Field of Search ........................... 438/301, 303, 438/305, FOR 168, 299, 294

[56] References Cited

U.S. PATENT DOCUMENTS

| | | | |
|---|---|---|---|
| 5,478,776 | 12/1995 | Luftman et al. | 438/301 |
| 5,512,506 | 4/1996 | Chang et al. | 438/305 |
| 5,599,734 | 2/1997 | Byun et al. | 438/301 |
| 5,736,419 | 4/1998 | Naem | 438/300 |

FOREIGN PATENT DOCUMENTS

| | | |
|---|---|---|
| 3-284853 | 12/1991 | Japan . |
| 4-79336 | 3/1992 | Japan . |

*Primary Examiner*—Peter Toby Brown
*Assistant Examiner*—Khanh B. Duong
*Attorney, Agent, or Firm*—Skjerven, Morrill, MacPherson, Franklin & Friel, L.L.P.; William W. Holloway

[57] ABSTRACT

A method of making an IGFET includes providing a semiconductor substrate with an active region, forming a gate over the active region, forming displacement material segments over portions of the active region outside the gate, implanting a dopant into the gate, the displacement material segments and the active region using a single implant step, such that a peak concentration of the dopant is in the gate and the displacement material segments, and a light concentration of the dopant implanted through one of the displacement material segments forms a lightly doped drain region in the active region, and forming a source and a drain wherein the drain includes the lightly doped drain region. In this manner, the lightly doped drain region and heavy doping for the gate can be provided using a single implant step.

23 Claims, 3 Drawing Sheets

METHOD OF FORMING LIGHTLY DOPED DRAIN REGION AND HEAVILY DOPING A GATE USING A SINGLE IMPLANT STEP

BACKGROUND OF THE INVENTION

1. Field of the Invention

The present invention relates to integrated circuit manufacturing, and more particularly to insulated-gate field-effect transistors.

2. Description of Related Art

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the channel and the substrate. The gate is separated from the semiconductor substrate by a thin insulating layer such as a gate oxide. The operation of the IGFET involves application of an input voltage to the gate, which sets up a transverse electric field in the channel in order to modulate the longitudinal conductance of the channel.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anisotropically etched to provide the gate. Thereafter, the gate provides an implant mask during the implantation of source and drain regions, and the implanted dopants are driven-in and activated using a high-temperature anneal that would otherwise melt the aluminum.

An important parameter in IGFETs is the threshold voltage ($V_T$), which is the minimum gate voltage required to induce the channel. In general, the positive gate voltage of an N-channel device must be larger than some threshold voltage before a conducting channel is induced, and the negative gate voltage of a P-channel device must be more negative than some threshold voltage to induce the required positive charge (mobile holes) in the channel. There are, however, exceptions to this general rule. For example, depletion-mode devices already have a channel with zero gate voltage, and therefore are normally on. With N-channel depletion-mode devices a negative gate voltage is required to turn the devices off, and with P-channel depletion-mode devices a positive gate voltage is required to turn the devices off.

If the source and body of an IGFET are tied to ground, the threshold voltage can be calculated as follows:

$$V_T = \phi_{ms} - 2\phi_f - Q_{tot}/C_{ox} - Q_{BO}/C_{ox} - \Delta V_T \quad (1)$$

where $\phi_{ms}$ is the work-function difference between the gate material and the bulk silicon in the channel, $\phi_f$ is the equilibrium electrostatic potential in a semiconductor, $Q_{tot}$ is the total positive oxide charge per unit area at the interface between the oxide and the bulk silicon, $C_{ox}$ is the gate oxide capacitance per unit area, $Q_{BO}$ is the charge stored per unit area in the depletion region, and $\Delta V_T$ is a threshold lowering term associated with short-channel effects. Expressions have been established for these various quantities in terms of doping concentrations, physical constants, device structure dimensions, and temperature. For example, the work-function difference $\phi_{ms}$ varies as a function of the doping concentration in a polysilicon gate. Therefore, the threshold voltage depends on the doping concentration in the polysilicon gate.

As IGFET dimensions are reduced and the supply voltage remains constant (e.g., 3V), the electric field in the channel near the drain tends to increase. If the electric field becomes strong enough, it can give rise to so-called hot-carrier effects. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

A number of techniques have been utilized to reduce hot carrier effects. One such technique is a lightly doped drain (LDD). The LDD reduces hot carrier effects by reducing the maximum lateral electric field. The drain is typically formed by two ion implants. A light implant is self-aligned to the gate, and a heavy implant is self-aligned to spacers adjacent to the gate. The spacers are typically oxides or nitrides. The purpose of the lighter first dose is to form a lightly doped region of the drain (or LDD) at the edge near the channel. The second heavier dose forms a low resistivity heavily doped region of the drain, which is subsequently merged with the lightly doped region. Since the heavily doped region is farther away from the channel than a conventional drain structure, the depth of the heavily doped region can be made somewhat greater without adversely affecting the device characteristics.

In the event a polysilicon gate is doped solely by the implant steps that provide source/drain doping, in some instances the doping concentration in the polysilicon gate may not be sufficient to provide the desired threshold voltage. Techniques for increasing the doping concentration in a polysilicon gate independently of source/drain doping are known in the art. For instance, the polysilicon layer that is subsequently etched to form the gate can be doped in situ as deposition occurs. In situ doping involves adding dopant gases such as diborane and phosphine to the chemical vapor deposition gases. Although combining doping and deposition in one step may appear simple, the control of film thickness, dopant uniformity, and deposition rate is greatly complicated by the addition of the dopant gases. Moreover, physical properties of the film such as grain size and grain orientation are affected. Alternatively, the polysilicon layer can be doped by solid phase diffusion. An advantage of this approach is its ability to introduce very high concentrations of the dopant in the polysilicon layer, however, a very high temperature is required and the potential exists for increasing the surface roughness. Furthermore, maximally doped polysilicon films are typically more important for other applications such as high value load resistors used in static memory, and doping studies. As yet another approach, the polysilicon layer can be doped by ion implantation. The implant energy is usually selected so that the peak concentration of the dopant is near the center of the polysilicon layer. This approach has the advantage of precise control over the dopant dose, however, an additional implant step becomes necessary.

Accordingly, a need exists for an improved method of making an IGFET that provides a polysilicon gate with the desired doping concentration without requiring additional implant steps.

SUMMARY OF THE INVENTION

An object of the invention is to provide an improved method of making an IGFET with a lightly doped drain region and an adequately doped gate. Generally speaking, this is accomplished using displacement material segments in close proximity to the sidewalls of the gate. The displacement material segments reduce the amount of a dopant introduced into an active region of the substrate during a subsequent implant step that also dopes the gate. In this manner, a lightly doped drain region and heavy doping for the gate can be provided using a single implant step.

In accordance with one aspect of the invention, a method of making an IGFET includes providing a semiconductor substrate with an active region, forming a gate over the active region, forming displacement material segments over portions of the active region outside the gate, implanting a dopant into the gate, the displacement material segments and the active region using a single implant step, such that a peak concentration of the dopant is in the gate and the displacement material segments, and a light concentration of the dopant implanted through one of the displacement material segments forms a lightly doped drain region in the active region. Furthermore, a light concentration of the dopant implanted through another of the displacement material segments can form a lightly doped source region in the active region.

Thereafter, the method may include stripping the displacement material segments, forming spacers adjacent to opposing sidewalls of the gate, implanting heavily doped source and drain regions thereby further increasing the doping concentration of the gate, and applying a high-temperature anneal to drive-in and activate the implanted dopants.

Preferably, the displacement material segments are formed by depositing a displacement material over the active region after forming the gate, applying polishing to remove the displacement material over the gate, and then applying a dry etch to remove portions of the displacement material outside the gate and no further from the substrate than the top surface of the gate, so that the displacement material segments are adjacent to the sidewalls of the gate and have substantially planar top surfaces that are closer to the substrate than is the top surface of the gate.

It is also preferred that the gate is polysilicon, and the displacement material is selected from the group consisting of silicon dioxide, silicon nitride, silicon oxynitride, doped glass, and metals.

Advantageously, two implant steps that provide the lightly and heavily doped drain regions can each provide heavy doping for the gate to ensure that the gate is adequately doped and the desired threshold voltage is obtained.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
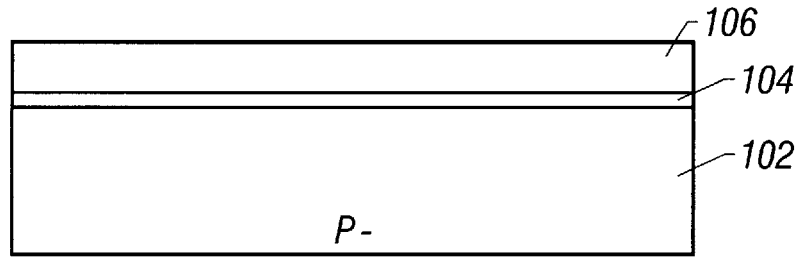
FIGS. 1A–1K show cross-sectional views of successive process steps for making an IGFET that includes forming a lightly doped drain region and heavily doping a gate using a single implant step in accordance with an embodiment of the invention.

In the drawings, depicted elements are not necessarily drawn to scale and like or similar elements may be designated by the same reference numeral throughout the several views.

In FIG. 1A, silicon substrate 102 suitable for integrated circuit manufacture is provided. Substrate 102 includes a P−−type epitaxial surface layer with a planar top surface disposed on a P+ base layer (not shown). The epitaxial surface layer has a boron background concentration on the order of $1 \times 10^{16}$ atoms/cm$^3$, a <100> orientation and a resistivity of 12 ohm-cm. For convenience of illustration, a single active region of substrate 102 is shown, and dielectric isolation (such as LOCOS) between adjacent active regions is not shown. A blanket layer of gate oxide 104, composed of silicon dioxide ($SiO_2$), is formed on the top surface of substrate 102 using tube growth at a temperature of 700 to 1000° C. in an $O_2$ containing ambient. Gate oxide 104 has a thickness of 50 angstroms. Thereafter, undoped polysilicon layer 106 is deposited by low pressure chemical vapor deposition on the top surface of gate oxide 104. Polysilicon layer 106 has a thickness of 2000 angstroms.

Figure 1B:
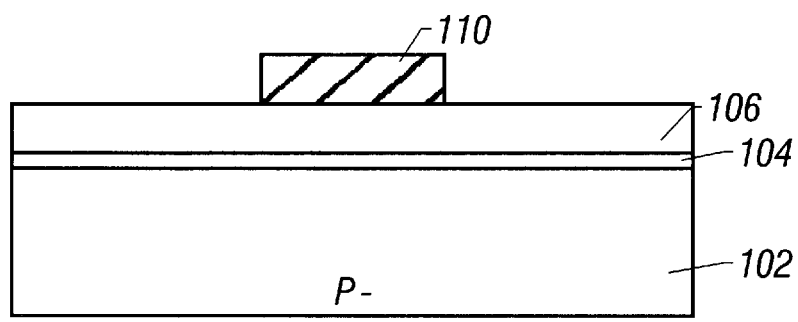

In FIG. 1B, photoresist layer 110 is deposited on polysilicon layer 106. A photolithographic system, such as a step and repeat optical projection system which generates deep ultraviolet light from a mercury-vapor lamp, uses a reticle to irradiate photoresist layer 110 with an image pattern. Thereafter, the irradiated portions of photoresist layer 110 are removed, and photoresist layer 110 includes openings above selected portions of substrate 102.

Figure 1C:
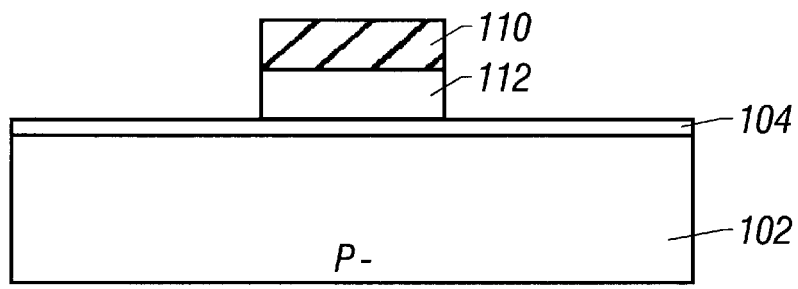

In FIG. 1C, an anisotropic dry etch is applied using photoresist layer 110 as an etch mask. Photoresist layer 110 protects the underlying regions of polysilicon layer 106, and the etch removes the regions of polysilicon layer 106 beneath the openings in photoresist layer 110. The etch is highly selective of polysilicon with respect to silicon dioxide, so only a negligible amount of gate oxide 104 is removed and substrate 102 is unaffected. The etch forms polysilicon gate 112 from the unetched portion of polysilicon layer 106. Polysilicon gate 112 has opposing vertical sidewalls separated by a length of 3500 angstroms, and a thickness (or height above the underlying gate oxide 104) of 2000 angstroms.

Figure 1D:
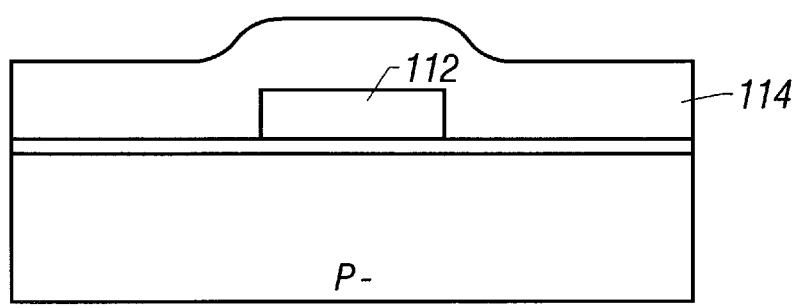

In FIG. 1D, photoresist layer 110 is stripped, and a blanket layer of silicon dioxide is deposited by plasma enhanced chemical vapor deposition at a temperature in the range of 300 to 450° C. to form oxide layer 114 over substrate 102. Oxide layer 114 has a thickness of 2500 angstroms and contacts the top surface and sidewalls of polysilicon gate 112.

Figure 1E:
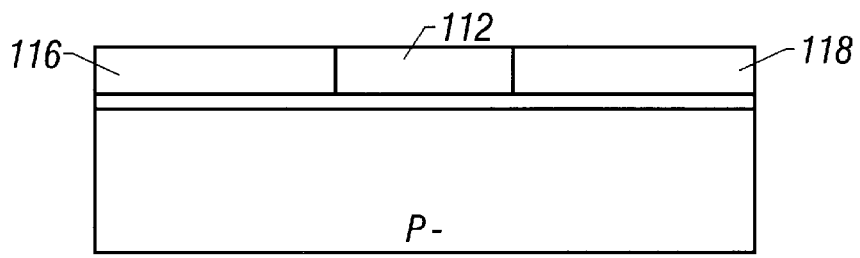

In FIG. 1E, the structure is planarized by applying chemical-mechanical polishing in the presence of an abrasive slurry that is highly selective of silicon dioxide with respect to polysilicon. The polishing grinds down oxide layer 114, and is discontinued using polysilicon gate 112 as a stop-layer. After polishing occurs, the remaining portions of oxide layer 114 form oxide segments 116 and 118. As is seen, the top surfaces of polysilicon gate 112 and oxide segments 116 and 118 are exposed and aligned with one another and form a planar surface.

Figure 1F:
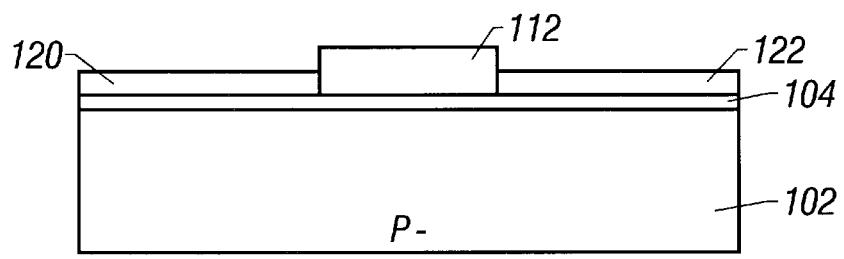

In FIG. 1F, a dry etch is applied that removes upper portions of oxide segments 116 and 118 while leaving intact lower portions of oxide segments 116 and 118. The dry etch is highly selective of silicon dioxide with respect to polysilicon, so only a negligible amount of polysilicon gate 112 is removed. In particular, the dry etch removes the upper 1600 angstroms of oxide segments 116 and 118 while leaving intact the lower 400 angstroms of oxide segments 116 and 118. Accordingly, after etching occurs, the remaining lower portions of oxide segments 116 and 118 form oxide segments 120 and 122, respectively, with a thickness of 400 angstroms and substantially planar top surfaces. Thus, the top surfaces of oxide segments 120 and 122 are about 1600 angstroms closer to substrate 102 than is the top surface of polysilicon gate 112. Furthermore, oxide segments 120 and 122 are adjacent to the sidewalls of polysilicon gate 112, and are disposed on gate oxide 104 with a thickness of about 50 angstroms.

Figure 1G:
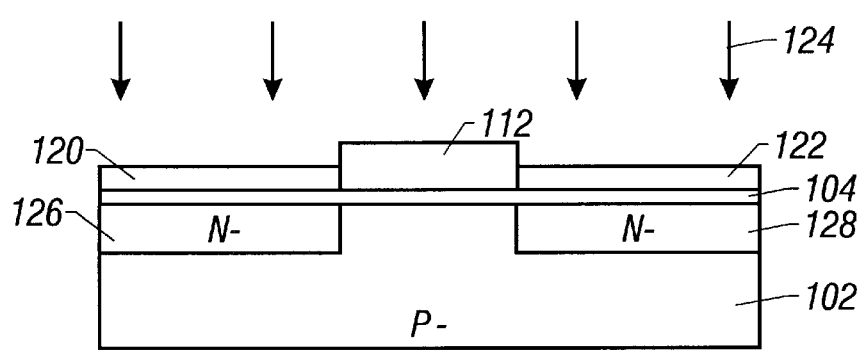

In FIG. 1G, lightly doped source and drain regions are implanted into the active region, and heavy doping is provided for the gate, by subjecting the structure to ion implantation of arsenic, indicated by arrows 124, at a dose of about $2 \times 10^{15}$ atoms/cm$^2$ and an energy of about 60 kiloelectron-volts, using polysilicon gate 112 as an implant mask, and using oxide segments 120 and 122 as displacement material segments. A peak concentration of the arsenic is implanted into polysilicon gate 112 and oxide segments 120 and 122, and thus the peak concentration of the arsenic is not implanted into substrate 102. Moreover, a substantial amount of the arsenic that impinges upon oxide segments 120 and 122 transfers through oxide segments 120 and 122 and through gate oxide 104 and is implanted into substrate 102; however, essentially all of the arsenic that impinges upon polysilicon gate 112 is implanted into polysilicon gate 112 and does not reach gate oxide 104 or substrate 102. As a result, lightly doped source/drain regions 126 and 128 are implanted into substrate 102 outside polysilicon gate 112 and are self-aligned to the opposing vertical sidewalls of polysilicon gate 112, polysilicon gate 112 becomes heavily doped with arsenic, and a channel region of substrate 102 between lightly doped source/drain regions 126 and 128 remains essentially devoid of arsenic. Lightly doped source/drain regions 126 and 128 are doped N– with an arsenic concentration in the range of about $1 \times 10^{17}$ to $1 \times 10^{18}$ atoms/cm$^3$. Moreover, the arsenic concentration in lightly doped source/drain regions 126 and 128 is about one-quarter the peak concentration of arsenic in polysilicon gate 112 and oxide segments 120 and 122.

Figure 1H:
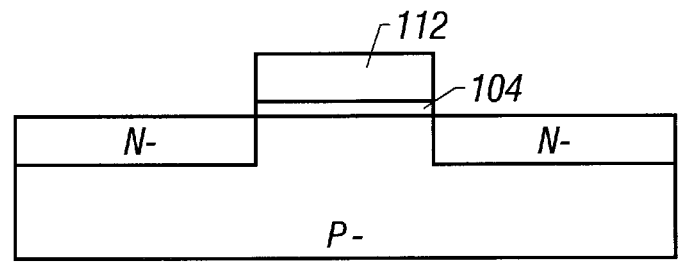

In FIG. 1H, a dry etch is applied that removes oxide segments 120 and 122 and the underlying portions of gate oxide 104. The dry etch is highly selective of silicon dioxide with respect to polysilicon, so only a negligible amount of polysilicon gate 112 is removed. The dry etch is also highly anisotropic, so only a negligible amount of gate oxide 104 beneath polysilicon gate 112 is removed.

Figure 1I:
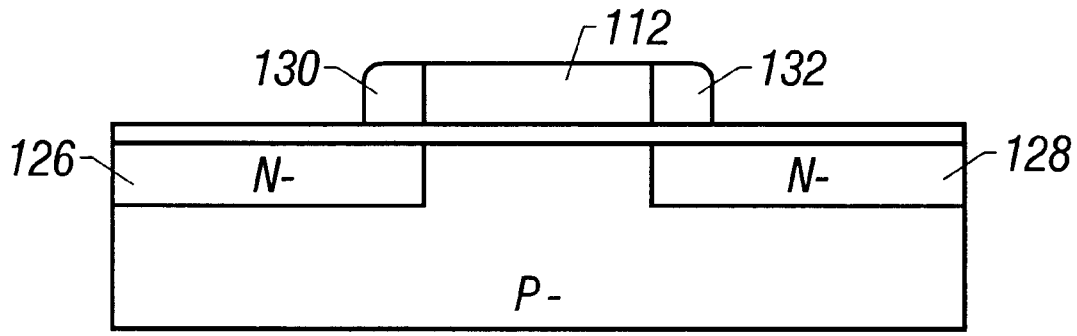

In FIG. 1I, an oxide layer with a thickness of 2500 angstroms is conformally deposited over the exposed surfaces by plasma enhanced chemical vapor deposition at a temperature in the range of 300 to 450° C. Thereafter, the structure is subjected to an anisotropic reactive ion etch that forms oxide spacers 130 and 132 adjacent to the opposing vertical sidewalls of polysilicon gate 112. Spacers 130 and 132 cover portions of lightly doped source/drain regions 126 and 128, respectively.

Figure 1J:
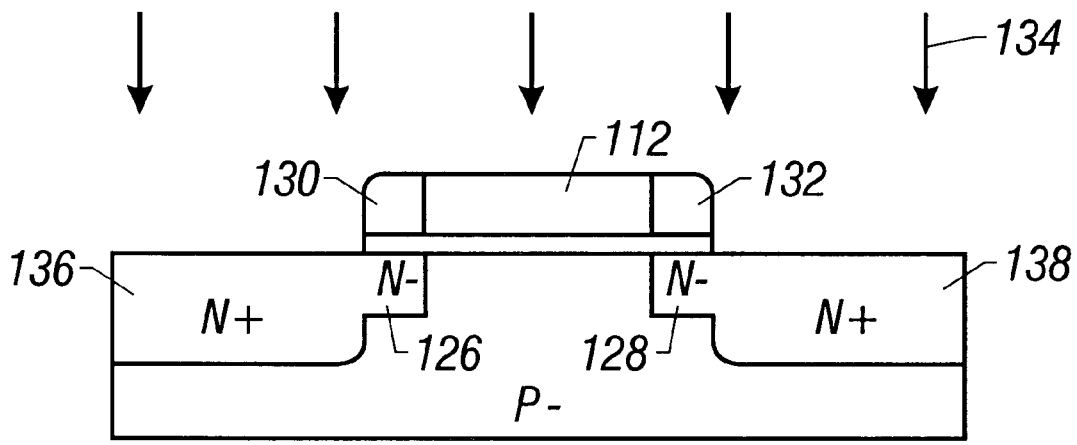

In FIG. 1J, heavily doped source and drain regions are implanted into the active region, and additional heavy doping is provided for the gate, by subjecting the structure to ion implantation of arsenic, indicated by arrows 134, at a dose in the range of $1 \times 10^{15}$ to $5 \times 10^{15}$ atoms/cm$^2$ and an energy of 60 kiloelectron-volts, using polysilicon gate 112 and spacers 130 and 132 as an implant mask. As a result, heavily doped source/drain regions 136 and 138 are implanted in substrate 102, are adjacent to lightly doped source/drain regions 126 and 128, respectively, and are self-aligned to the outside edges of spacers 130 and 132, respectively. Heavily doped source/drain regions 136 and 138 are doped N+ with an arsenic concentration in the range of about $1 \times 10^{18}$ to $1 \times 10^{20}$ atoms/cm$^3$. Furthermore, the depth of heavily doped source/drain regions 136 and 138 exceeds that of lightly doped source/drain regions 126 and 128. Of importance, polysilicon gate 112 has now been subjected to two implant steps with heavy doses, thereby providing polysilicon gate 112 with sufficient doping to provide the desired threshold voltage while also providing both lightly and heavily doped source and drain regions.

Figure 1K:
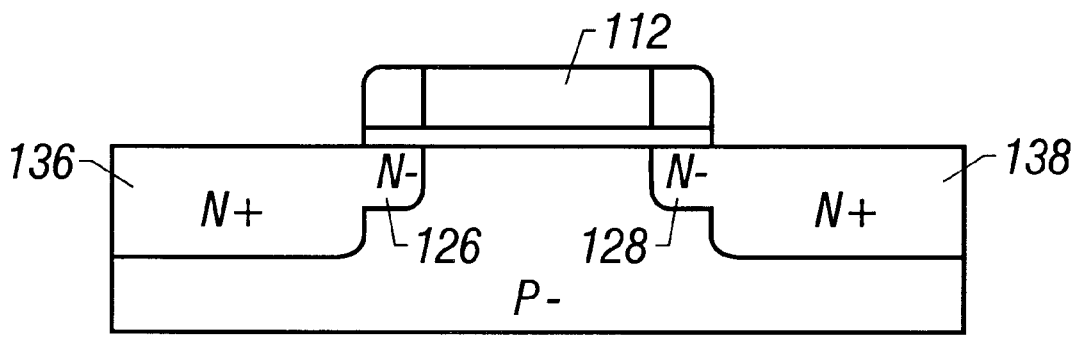

In FIG. 1K, the device is annealed to remove crystalline damage and to drive-in and activate the implanted dopants by applying a rapid thermal anneal on the order of 950 to 1050° C. for 10 to 30 seconds. Source regions 126 and 136 merge to form a source and drain regions 128 and 138 merge to form a drain for an N-channel IGFET controlled by polysilicon gate 112.

Further processing steps in the fabrication of IGFETs typically include forming salicide contacts on the gates, sources and drains, forming a thick oxide layer over the active regions, forming contact windows in the oxide layer to expose the salicide contacts, forming interconnect metallization in the contact windows, and forming a passivation layer over the metallization. In addition, earlier or subsequent high-temperature process steps can be used to supplement or replace the anneal step to provide the desired anneal, activation, and drive-in functions. These further processing steps are conventional and need not be repeated herein. Likewise the principal processing steps disclosed herein may be combined with other steps apparent to those skilled in the art.

The present invention includes numerous variations to the embodiments described above. For instance, the gate can be various conductors, and the gate insulator and spacers can be various dielectrics such as silicon dioxide, silicon nitride and silicon oxynitride. The displacement material segments can be silicon dioxide, silicon nitride, silicon oxynitride, doped glass, a metal such as aluminum, or combinations thereof The thickness of the displacement material segments can be adjusted as necessary to provide the optimized dopant concentrations in the lightly doped source/drain regions. If desired, the spacers and heavily doped source/drain regions can be formed before forming the displacement material segments, and the displacement material segments need not always be stripped. Furthermore, an asymmetrical device can be formed in which a heavily doped source region is substantially aligned with a sidewall of the gate, either before or after forming the displacement material segments and implanting the lightly doped drain region. The conductivity types can be reversed. Suitable N-type dopants include arsenic and phosphorus; suitable P-type dopants include boron $B_{10}$, boron $B_{11}$, and $BF_x$ species such as $BF_2$.

The invention is particularly well-suited for fabricating N-channel MOSFETs, P-channel MOSFETs and other types of IGFETs, particularly for high-performance microprocessors where high circuit density is essential. Although a single IGFET has been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of making an IGFET, the method comprising:
   providing a semiconductor substrate with an active region;
   forming a gate over the active region;
   forming displacement material segments over portions of the active region outside the gate;
   implanting a dopant into the gate, the displacement material segments and the active region using a single implant step, such that a peak concentration of the dopant is in the gate and the displacement material segments, and a light concentration of the dopant implanted through one of the displacement material segments forms a lightly doped drain region in the active region; and
   forming a source and a drain, wherein the drain includes the lightly doped drain region.

2. The method of claim 1, wherein forming the displacement material segments includes depositing a displacement material over the active region and then removing the displacement material over the gate.

3. The method of claim 2, wherein removing the displacement material over the gate includes polishing the displacement material.

4. The method of claim 1, including removing the displacement material segments after implanting the dopant.

5. The method of claim 1, wherein implanting the dopant includes using the gate as an implant mask such that essentially none of the dopant is implanted through the gate.

6. The method of claim 1, wherein a light concentration of the dopant implanted through another of the displacement material segments forms a lightly doped source region in the active region, the lightly doped source and drain regions are substantially aligned with opposing sidewalls of the gate, and the source includes the lightly doped source region.

7. The method of claim 6, wherein forming the source and drain includes implanting a second dopant into the active region to form heavily doped source and drain regions in the active region using the gate and spacers adjacent to the sidewalls of the gate as an implant mask.

8. The method of claim 7, including forming the lightly doped source and drain regions before forming the heavily doped source and drain regions.

9. The method of claim 7, including forming the lightly doped source and drain regions after forming the heavily doped source and drain regions.

10. The method of claim 1, wherein the displacement material segments are adjacent to opposing sidewalls of the gate.

11. The method of claim 1, wherein the displacement material segments are selected from the group consisting of silicon dioxide, silicon nitride, silicon oxynitride, doped glass and metals.

12. The method of claim 1, wherein the gate is polysilicon.

13. A method of making an IGFET, the method comprising:
   providing a semiconductor substrate with an active region;
   forming a gate insulator on the active region;
   forming a gate on the gate insulator and over the active region;
   forming displacement material segments over portions of the active region outside the gate, wherein the displacement material segments have substantially planar top surfaces that are closer to the substrate than is a top surface of the gate, and the displacement material segments are in close proximity to opposing sidewalls of the gate;
   implanting a dopant into the gate, the displacement material segments and the active region using a single implant step, such that a peak concentration of the dopant is in the gate and the displacement material segments but not in the active region, a light concentration of the dopant implanted through the displacement material segments forms lightly doped source and drain regions in the active region that are substantially aligned with the sidewalls of the gate, and essentially none of the dopant is implanted through the gate into the active region; and
   forming a source and a drain that include the lightly doped source and drain regions.

14. The method of claim 13, wherein forming the displacement material segments includes depositing a displacement material over the substrate and then polishing the displacement material to remove the displacement material over the gate.

15. The method of claim 14, wherein forming the displacement material segments includes applying an etch after the polishing step, wherein the etch removes a substantial amount of the displacement material outside the gate.

16. The method of claim 13, including removing the displacement material segments after implanting the dopant, then forming spacers adjacent to the sidewalls of the gate, and implanting a second dopant into the gate and the active region to increase a doping concentration of the gate and to form heavily doped source and drain regions in the active region using the gate and spacers as an implant mask.

17. The method of claim 13, wherein the gate is polysilicon, and the displacement material segments are selected from the group consisting of silicon dioxide, silicon nitride, silicon oxynitride, doped glass, and metals.

18. A method of making an IGFET, including forming lightly doped source and drain regions and heavily doping a gate using a single implant step, the method comprising performing in the sequence set forth:
   providing a semiconductor substrate with an active region of first conductivity type;
   forming a gate oxide on the active region;
   forming a polysilicon layer on the gate oxide;
   forming a masking layer over the polysilicon layer;
   etching the polysilicon layer through openings in the masking layer such that an unetched portion of the polysilicon layer over the active region forms a gate;
   depositing a continuous layer of displacement material over the active region;
   removing the displacement material over the gate and upper portions of the displacement material outside the gate such that lower portions of the displacement material outside the gate form displacement material segments in close proximity to opposing sidewalls of the gate and with substantially planar top surfaces that are substantially closer to the substrate than is a top surface of the gate;
   implanting a first dopant of second conductivity type into the gate, the displacement material segments and the active region using a single implant step, such that a peak concentration of the first dopant is in the gate and the displacement material segments but not in the active region, a light concentration of the first dopant implanted through the displacement material segments forms lightly doped source and drain regions in the active region that are substantially aligned with the sidewalls of the gate, and essentially none of the first dopant is implanted through the gate into the active region;

stripping the displacement material segments;

forming spacers adjacent to the sidewalls of the gate;

implanting a second dopant of second conductivity type into the gate and the active region using the gate and the spacers as an implant mask to increase a doping concentration of the gate and to form heavily doped source and drain regions in the active region; and applying a thermal cycle to activate and drive-in the first and second dopants, hereby forming a source that includes the lightly and heavily doped source regions and forming a drain that includes the lightly and heavily doped drain regions.

19. The method of claim 18, including implanting the first dopant with a dose of at least $1 \times 10^{15}$ atoms/cm$^2$, and implanting the second dopant with a dose of at least $1 \times 10^{15}$ atoms/cm$^2$.

20. The method of claim 18, wherein removing the displacement material includes polishing the displacement material to remove the displacement material over the gate, then applying a dry etch to remove portions of the displacement material that are outside the gate and no further from the substrate than is the top surface of the gate.

21. The method of claim 18, wherein vertical distances between the top surfaces of the displacement material segments and the substrate are at most one-half of a vertical distance between the top surface of the gate and the substrate.

22. The method of claim 18, wherein the light concentration of the first dopant is at most one-quarter of the peak concentration of the first dopant.

23. The method of claim 18, wherein the displacement material is selected from the group consisting of silicon dioxide, silicon nitride, silicon oxynitride, doped glass and metals.

* * * * *